United States Patent

Lange et al.

[11] Patent Number: 6,127,220
[45] Date of Patent: Oct. 3, 2000

[54] MANUFACTURING METHOD FOR A CAPACITOR IN AN INTEGRATED STORAGE CIRCUIT

[75] Inventors: Gerrit Lange; Martin Franosch; Volker Lehmann, all of München; Hans Reisinger, Grünwald; Herbert Schäfer, Hoöhenkirchen-Sieg.Brunn; Reinhard Stengl, Stadtbergen; Hermann Wendt, Grasbrunn, all of Germany

[73] Assignee: Siemens Aktiengesellschaft, Munich, Germany

[21] Appl. No.: 09/312,571

[22] Filed: May 14, 1999

[30] Foreign Application Priority Data

May 14, 1998 [DE] Germany ............ 198 21 776

[51] Int. Cl.[7] ............................... H01L 21/8242
[52] U.S. Cl. ............................ 438/254; 438/396
[58] Field of Search ............................ 438/254, 396

[56] References Cited

U.S. PATENT DOCUMENTS

| 5,155,657 | 10/1992 | Oehrlein et al. | 361/313 |
|---|---|---|---|
| 5,196,365 | 3/1993 | Gotou | 438/396 |
| 5,716,884 | 2/1998 | Hsue et al. | 438/254 |

FOREIGN PATENT DOCUMENTS

| 0 415 530 B1 | 3/1991 | European Pat. Off. . |
|---|---|---|
| 0 779 656 A2 | 6/1997 | European Pat. Off. . |
| 2 285 338 | 7/1995 | United Kingdom . |

OTHER PUBLICATIONS

Journal of the Electrochemical Society, vol. 137, No. 11, Nov. 1990 (Seidel et al.), pp. 3626–3632, "Anisotropic Etching of Crystalline Silicon in Alkaline Solutions".

International Electron Devices Meeting, Dec. 1988, pp. 592–595, 3–Dimensional Stacked Capacitor Cell for 16M and 64M Drams (Ema et al.).

*Primary Examiner*—John F. Niebling
*Assistant Examiner*—Jennifer M. Kennedy
*Attorney, Agent, or Firm*—Herbert L. Lerner; Laurence A. Greenberg; Werner H. Stemer

[57] ABSTRACT

On a carrier a layer sequence is applied which contains alternatingly layers made of a first conducting material and a second material in which both materials are different from a carrier material. An opening is made in the layer sequence, which is filled with a conducting material so that a central supporting structure is produced. Then the layer sequence is structured corresponding to the dimensions of a capacitor and the layers made of the second material are removed selectively, so that a first capacitor electrode is formed. The layer sequence may have especially $p^+$-/$p^-$ silicon layers or silicon/germanium layers. An etch-stop layer can also be incorporated as the lowest or second-lowest layer.

10 Claims, 6 Drawing Sheets

MANUFACTURING METHOD FOR A CAPACITOR IN AN INTEGRATED STORAGE CIRCUIT

BACKGROUND OF THE INVENTION

Field of the Invention

Capacitors are needed in a number of integrated semiconductor circuits, for example, in dynamic random access memory (DRAM) circuits or A/D converters. In many cases, the problem arises to realize a high or sufficient capacitance for the requirements with minimum space occupied. The problem is especially severe in DRAM circuits in which each storage cell has a storage capacitor and a selecting transistor, while the space available for a storage cell is being continuously reduced. At the same time, for reliable storage of the charge and distinguishability of the information to be read, the storage capacitors must retain a certain minimum capacitance. The minimum capacitance is considered to be 25 fF at the present time.

In order to realize the maximum capacitance of the storage capacitor with a given space requirement, among others, trench capacitors are known in which the capacitor electrodes are disposed along the side walls of a trench located in the substrate.

Another cell concept is the so-called stacked capacitor cell in which the capacitor is disposed as a stacked capacitor above the corresponding selecting transistor and mostly also above the bit line. As a result of this, the entire base area of the cell can be utilized for the capacitor and merely sufficient insulation to the neighboring storage capacitor needs to be ensured. This concept has the advantage that it is highly compatible with a logic process.

A storage cell configuration with a stacked capacitor is known from European Patent EP 415 530 B1. The stacked capacitor includes a polysilicon structure with several polysilicon layers disposed essentially parallel on top of one another, connected to one another with a side support. The layers, which are disposed in the manner of radiator ribs, lead to a significant enlargement of the surface of the polysilicon structure in comparison to the projection of the polysilicon structure onto the substrate surface; such a capacitor is mostly called a "fin-stacked capacitor". The polysilicon structure is formed by alternating deposits of polysilicon layers and selectively etchable silicon oxide or carbon layers on the surface of the substrate. Then the layers are structured, producing side coverage (spacer made of polysilicon) on at least one side of the layer structure and selective etching of the silicon oxide or carbon layers. The polysilicon structures are doped with arsenic. Then, a silicon oxide being a capacitor dielectric is formed by thermal oxidation, onto which a cell plate made of doped polysilicon is deposited.

From the European Patent EP 415 530 B1 and an article by Ema et al. in International Electron Devices Meeting, December 1988, p. 592–595, a storage cell configuration with a multi-layer stacked capacitor (called fin-stacked capacitor) is known, which has a central supporting structure with horizontal lamellae surrounding the supporting structure as a storage electrode. The manufacturing method provides that first an insulating layer consisting of silicon oxide and an etch-stop layer be applied above the selecting transistor and then a layer sequence with alternating silicon oxide layers and n-doped polysilicon layers is deposited. Then an opening is made through the layer sequence, the etch-stop layer and the silicon oxide layer all the way to the S/D region of the transistor by etching, filling it with polysilicon, so that, at the same time, the transistor connection and the supporting structure for the polysilicon layers are formed. The layer sequence is structured corresponding to the dimensions of the capacitor and then the $SiO_2$ layers are removed by a wet method, where the etch-stop layer is necessary to protect the underlying $SiO_2$ layer. The production of the contact hole is difficult because accurate adjusting to the S/D region is necessary through a number of layers (and three different etching steps are carried out in succession). The etch-stop layer is absolutely necessary, which increases the cost of the process.

In Published, European Patent Application EP 779 656 A2, another manufacturing method is described for a fin-stacked capacitor with an outside supporting structure. A layer structure of alternating $p^+/p^-$-doped silicon layers is produced. By etching and opening all the way to the underlying substrate, each layer structure, including the surrounding supporting structure, is separated into two separate partial regions and from each partial region a capacitor is formed which then has a supporting structure on three sides.

SUMMARY OF THE INVENTION

It is accordingly an object of the invention to provide a manufacturing method for a capacitor in an integrated storage circuit that overcomes the above-mentioned disadvantages of the prior art methods of this general type, which is easy to perform and is characterized by high process reliability.

With the foregoing and other objects in view there is provided, in accordance with the invention, a method for producing a capacitor in an integrated circuit, which includes:

applying a layer sequence on a carrier formed of a carrier material, the layer sequence containing alternatingly layers made of a conducting first material and a second material, the conducting first material and the second material being different from the carrier material;

forming an opening in the layer sequence;

filling in the opening with a conducting material and forming a supporting structure from the conducting material;

structuring the layer sequence and the supporting structure in an anisotropic etching process resulting in a layer structure corresponding to lateral dimensions of a capacitor and having an internal supporting structure;

removing selectively the layers formed of the second material with respect to the layers made of the conducting first material and the internal supporting structure;

applying a capacitor dielectric on free surfaces of the layers made of the conducting first material and of the internal supporting structure; and applying a counter electrode on a surface of the capacitor dielectric.

In the invention, first, onto a carrier, the surface of which consists essentially of an insulating carrier material, which can contain an insulating layer with an embedded connection in it, a layer sequence is applied which has alternatingly a layer of the conducting first material and a layer of she second material. The first and second materials are different from the carrier material and the second material is such that it can be etched selectively with respect to the first material. In the layer sequence an opening is formed which extends through the entire layer sequence and the opening is filled with a conducting material. Then, in an anisotropic etching process, the entire layer sequence is structured corresponding to the lateral dimensions of a capacitor so that a layer structure with sides is formed. With the aid of selective etching with respect to the first material and the supporting structure, the layers of the second material are removed. An etching process with an isotropic component is used, so that only the layers made of the first material and the supporting structure remain and form the first capacitor electrode. The free surfaces of the layers made of the first material and of the supporting structure are provided with a capacitor dielectric. A second electrode is formed on the surface of the capacitor dielectric.

The layers made of the first material and the supporting structure can be formed from $p^+$-doped silicon with a dopant concentration of $>10^{20}$ cm$^{-3}$ and the layers made of the second material can be formed from $p^-$-doped silicon with a dopant concentration of $<10^{19}$ cm$^{-3}$. It is known from H. Seidel et al., Journal of Electrochemical Society, Volume 137 (1990), page 3626 ff., that the $p^-$-doped silicon can be etched selectively with respect to $p^+$-doped silicon. Etching rate differences up to a factor of 1000 were achieved between silicon with a boron doping of $>10^{20}$ cm$^{-3}$ and silicon with a boron doping of $<10^{19}$ cm$^{-3}$.

$P^+$-doped silicon and $p^-$-doped silicon can be deposited in the same reactor. As a result of this, the layer sequence can be produced without changing the installation by merely switching the process parameters. This results in a significant simplification of the process.

In another variant, the layers of the first material can be made from doped silicon and the layers of the second material can be made of a germanium-containing material, for example, pure germanium or germanium and silicon. When the layers are made from germanium and silicon, the germanium content is preferably between 10% and 100%. The silicon content lies between 0% and 90%. The germanium-containing layers may be deposited doped or undoped.

The above germanium-containing layers can be etched by wet chemistry with good selectivity to silicon. When using an etching mixture that contains HF, $H_2O_2$ and $CH_3COOH$, the selectivity of the etching to silicon is 1:30 to 1:1000. In this etching, the selectivity with respect to silicon oxide and silicon nitride is about 1:30 to 1:1000.

Using choline, the silicon layers can be etched selectively with respect to germanium.

Since the diffusion coefficients of germanium n silicon and silicon in germanium are extremely low, the layer sequence remains unchanged, even at the high temperatures needed in the process, for example, 800° C.

Preferably, the layers made from doped silicon are formed in a CVD process using silane as a process gas in the temperature range between 400 and 600° C. at a pressure between 10 and 400 torr and a silane flow rate of 30 to 300 sccm with deposition rates of 10 to 100 nm per minute. The germanium-containing layers are preferably produced by CVD deposition using germane or germane and disilane in the process gas at a temperature between 400 and 600° C. and at a pressure between 10 and 400 torr, where the germane flow rate and optionally the disilane flow rate can be adjusted to be between 30 and 300 sccm and the deposition rate lies between 10 and 100 nm per minute.

The doped silicon layers are preferably deposited doped in situ. For this purpose, a doping gas, for example, arsine, phosphine or diborane, is introduced during deposition. the layers of doped silicon and the supporting structure may be formed either from n-doped or p-doped silicon.

Layers containing doped silicon and germanium can be deposited in the same reactor. As a result of this, the sequence of layers can be produced without changing the installation, by merely switching the process parameters.

In applications in which the supporting structure and the layers of doped silicon, that is, the first capacitor electrode, are to be connected electrically with an area in the substrate, it is advantageous to select the doping of the supporting structure and the doping of the doped silicon corresponding to the doping of the substrate area in order to avoid the formation of a pn transition. The first capacitor electrode can then be connected directly to the substrate area without having to form another conducting material between these structures. In the case of an n-doped substrate region, therefore, $n^+$-doped silicon can be used as capacitor electrode.

The layers of doped silicon can be polycrystalline, as well as crystalline or amorphous.

The carrier material consists on its surface essentially of an insulating material, preferably silicon oxide. The carrier surface may contain a connecting structure for the lower capacitor electrode, which is especially connected with an S/D region of the transistor. It is advantageous when the carrier surface is planed, for example, using chemical-mechanical polishing.

The various layer sequences can be realized in various embodiments of the invention.

In a first embodiment, the layer sequence is applied directly onto the carrier. The lowermost layer consists of the conducting first material. The lowermost layer then ensures contact to the connecting structure, and misadjustment of the opening and thus of the supporting structure is noncritical. When etching the opening, it must be merely ensured that an area of the lowermost layer made of the second material, that is, of the second lowest layer of the layer sequence, is freed. On the other hand, it is not critical if the lowermost first material is etched or etched through (but too strong etching of the connecting structure should be avoided). Since the first and second material is chosen to be different from the insulating carrier material, an etching process can be used which is selective with respect to the carrier and therefore the underlying structures will not be attacked, even if the opening is displaced with respect to the connecting structure. Similarly, a selective etching process with respect to the carrier can be used for structuring corresponding to the capacitor dimensions.

In a second embodiment, first an auxiliary layer acting as etch-stop is applied onto the carrier and then the layer sequence is deposited on that. The lowermost layer of the layer sequence can be either a layer made of the first or second material. The etching process for the production of the opening is then carried out in two steps. First, the layers from the first and second material are etched all the way to the auxiliary layer and then the etching proceeds through the auxiliary layer. The first etching step does not have to be selective with respect to the carrier material and the same applies to the removal of the layers made of the second material (production of lamellae). Etching of the filled contact hole will be safely avoided.

In a third embodiment, a layer made of the first material and then an auxiliary layer acting as an etch-stop are applied onto the carrier; then, the layer sequence (beginning with a layer made of the first material) is deposited onto the auxiliary layer. The etching process for the production of the opening is then carried out in two steps: first the layer sequence is etched all the way to the auxiliary layer and then the etching is continued through the auxiliary layer. The opening ends on the lowermost layer made of the first material and this layer represents a reliable contact to the connecting structure. Etching of the filled contact hole is surely avoided. Any possible misadjustment of the opening with respect to the connecting structure is insignificant. Furthermore, at this point, an etching process can be selected which is not selective with respect to the carrier material.

In all the practical examples, the uppermost layer of the layer sequence preferably consists of the second material and the opening is filled by depositing on the entire area a conducting layer, preferably made of the first material, so that simultaneously with the supporting structure, another lamella of the first capacitor electrode is formed.

The opening for holding the supporting structure can be in the form of a blind hole or of a longitudinally extended trench, so that the capacitor electrode has either a column-shaped supporting structure, which is surrounded by lamellae on all sides or has a wall-shaped supporting structure from which the lamellae start on two sides. The second variation leads to a higher mechanical stability of the electrode. In the first variation, the etching process used for the production of the layer structure needs to have only sufficient selectivity to the carrier material or to the auxiliary material, and the etch rates of the first and second materials can be different, since the supporting structure does not have to be etched uniformly with the layer structure.

The supporting structure, consisting of doped silicon, can be formed by in-situ doped deposition of a doped polysilicon layer. The deposition can be carried out in the temperature range below 800° C., so that, even in the case of a layer sequence of $p^+/p^-$-silicon, interdiffusion of the layers is avoided.

In order to increase the integration density, the opening is preferably produced with the diameter of the minimum structure size F. The minimum distance between neighboring capacitors is F.

In the manufacture of capacitors as storage capacitors for a dynamic storage cell configuration, the capacitors are preferably manufactured as a stacked capacitor. In this case, the substrates include a semiconductor substrate with selecting transistors, bit lines, word lines and an insulating layer, onto the surface of which the sequence of layers is deposited. Preferably, the insulating layer is planed (for example, by chemical-mechanical polishing) so that the layer sequence is formed on an essentially planar surface.

Other features which are considered as characteristic for the invention are set forth in the appended claims.

Although the invention is illustrated and described herein as embodied in a manufacturing method for a capacitor in an integrated storage circuit, it is nevertheless not intended to be limited to the details shown, since various modifications and structural changes may be made therein without departing from the spirit of the invent-on and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
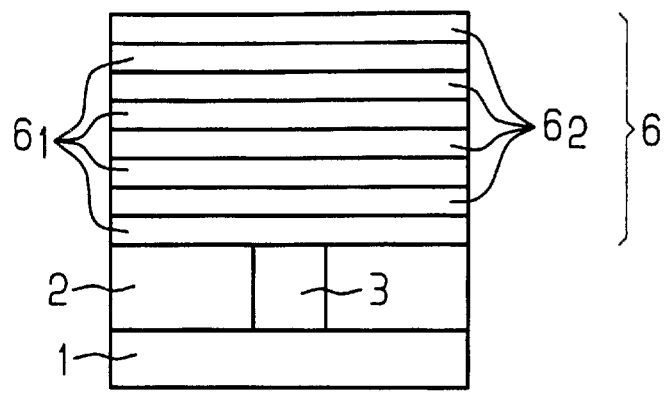
FIGS. 1 to 6 are diagrammatic, sectional views through a substrate on which a first practical example of the method according to the invention is illustrated with the aid of a DRAM storage cell.

In all the figures of the drawing, sub-features and integral parts that correspond to one another bear the same reference symbol in each case. Referring now to the figures of the drawings in detail and first, particularly, to FIG. 1 thereof, there is shown a substrate 1 having an insulating or carrier layer 2 applied thereon. The substrate 1 is, for example, a semiconductor substrate, especially a monocrystalline silicon chip with selecting transistors, word lines and bit lines. The insulating layer is made, for example, from silicon oxide and is planed. In the insulating layer 2, contact holes 3 are opened and filled with electrically conducting material, for example, with doped polysilicon, tungsten, tantalum, titanium, titanium nitride or tungsten silicide. The contact holes 3 are disposed in such a way that they always extend to a source/drain region of a selecting transistor in the substrate 1 (see FIG. 6). On the surface of the insulating layer 2, a layer sequence 6 is produced, which contains alternatingly a layer $6_1$, made of a conducting first material, and a layer $6_2$, made of a second material, where the lowermost layer consists of the first material and the two materials can be etched differently and selectively with respect to the carrier material. The first material is, for example, $p^-$-doped polysilicon with a dopant concentration of approximately $5 \times 10^{20}$ cm$^{-3}$, the second material is, for example, $p^-$-doped polysllicon with a dopant concentration of $1 \times 10^{19}$ cm$^{-3}$, and the layer thicknesses are, for example, 20 nm. Alternatively, the layers $6_1$ can be made of the first material, doped silicon layers, and the layer $6_2$ from the second material, germanium-containing layers. The layers made of doped silicon $6_1$ can either be $p^+$-doped or $n^+$-doped and have a dopant concentration of, for example, $5 \times 10^{20}$ cm$^{-3}$. The layers made of doped silicon, $6_1$, and the germanium-containing layers, $6_2$, are deposited in a layer thickness of 20 nm, for example, by CVD deposition using silane or germane or germane and disilane at a temperature between 400° C. and 600° C. and at a pressure between 10 and 400 torr. The gas flow is between 30 and 300 sccm and the deposition rate is between 10 and 100 nm/min.

Figure 2:
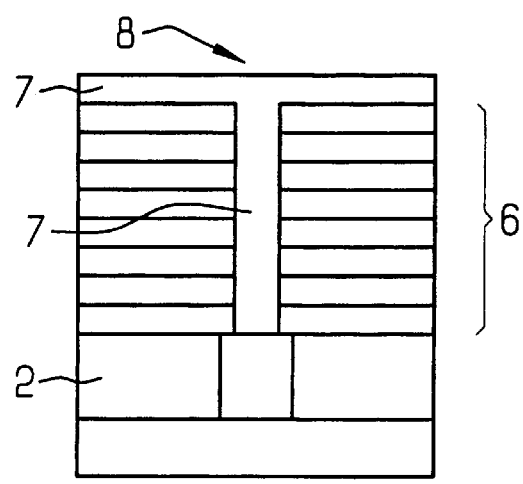

Then, in the layer sequence 6, a opening 8 is obtained by anisotropic etching using a mask as is shown in FIG. 2. The opening extends at least so far during the layer sequence that the surface of the lowermost conducting layer is released. It is not critical as to how deep the lowermost conducting layer is etched or etched through. This also applies to the displacement of the opening with respect to the connecting structure 3, because an etching process that is selective with respect to the carrier material can be chosen. The opening is preferably centered on the connecting structure 3. Anisotropic etching can be done with CF$_4$ and SF$_6$ for the layer sequence in both the variants explained above. Then, a supporting structure 7 is formed in the opening. Preferably, an in-situ doped polysilicon layer is deposited on the entire area. If the layer sequence consists of $p^+/p^-$-silicon, the maximum temperature is chosen to be 750° C. in order to avoid interdiffusion between the layers. When the uppermost layer of the layer sequence consists of the second material, the polysilicon layer remaining on the surface forms an additional lamella of the electrode, so that the capacity is increased in an especially simple manner.

Figure 3:
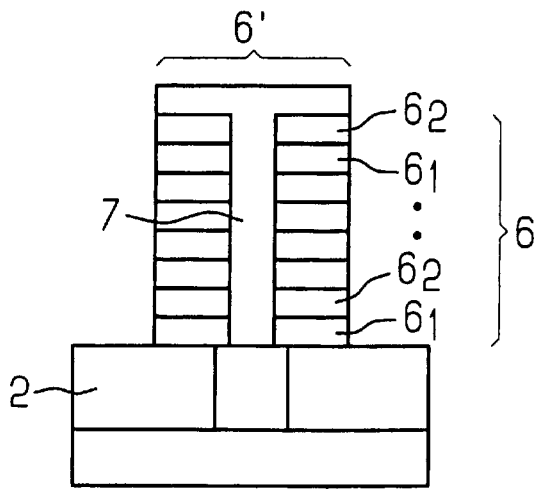

In FIG. 3, the upper layer sequence 6, 7 including the uppermost polysilicon layer, is shown to be structured with an anisotropic etching process to a layer structure 6', the lateral dimensions of which correspond to that of the capacitor electrode to be produced. The supporting structure lies within and preferably approximately centrally in the supporting structure. The etching is done to the carrier surface of the carrier and on the side of the layer structure, the surface of the layer sequence is free.

Figure 4:
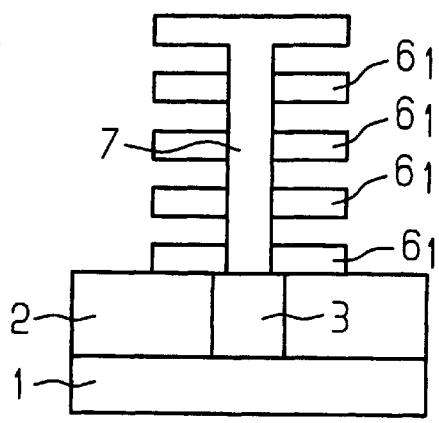

Using selective etching with respect to the first material and the insulating layer 2, the remaining parts of the layers from the second material $6_2$ are removed as is shown in FIG. 4. In the case of the p⁻-doped silicon layer $6_2$, for example, the selective etching is done in an alkaline etching solution that contains ethylenediamine, pyrocatechol, pyrazine and water. Preferably, the concentration of the solution is in the following range: 1 L ethylenediamine, 160 g of pyrocatechol, 6 g of pyrazine and 133 ml of water. Moreover, as etching solution, one can also use KOH with a concentration in the range from 10 to 50 weight %. This etching has a selectivity of at least 1:500 with respect to the p⁺-doped polysilicon and p⁻-doped polysilicon. In the case of germanium-containing layers $6_2$, the etching is done, for example, by wet chemical methods with an etching mixture that contains HF, $H_2O_2$ and $CH_3COOH$. Preferably, the concentration of the solution is in the following range: 1 part HF, 200 parts $H_2O_2$, 300 parts $CH_3COOH$. This etching has a selectivity of 1:30 to 1:1000 with respect to the doped polysilicon. With reference to silicon oxide and silicon nitride, it has a selectivity of 1:30 to 1:1000.

The layers made from the first material and the supporting structure, which are not attacked by selective etching, are connected to one another mechanically and electrically.

Figure 5:
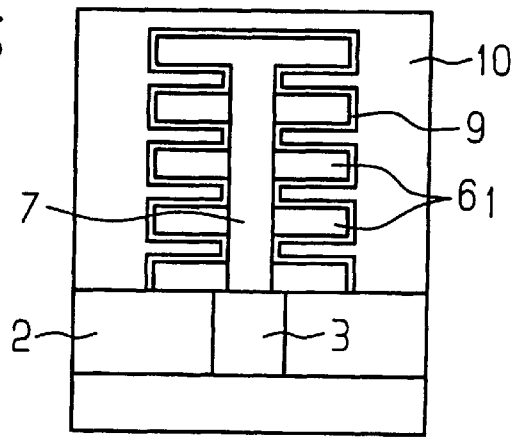

The surface of the layers made of the doped silicon $6_1$ and the supporting structure 7 are provided with a capacitor dielectric 9 as is shown in FIG. 5. The capacitor dielectric 9 is formed, for example, from a post-oxidized silicon nitride layer. By deposition of an in-situ doped polysilicon layer, a counter electrode 10 is formed. The counter electrode 10 can consist of a p⁺- or n⁺-doped polysilicon layer (doping always for example $5 \times 10^{20}$ cm⁻³) or of a germanium-containing layer.

Figure 6:
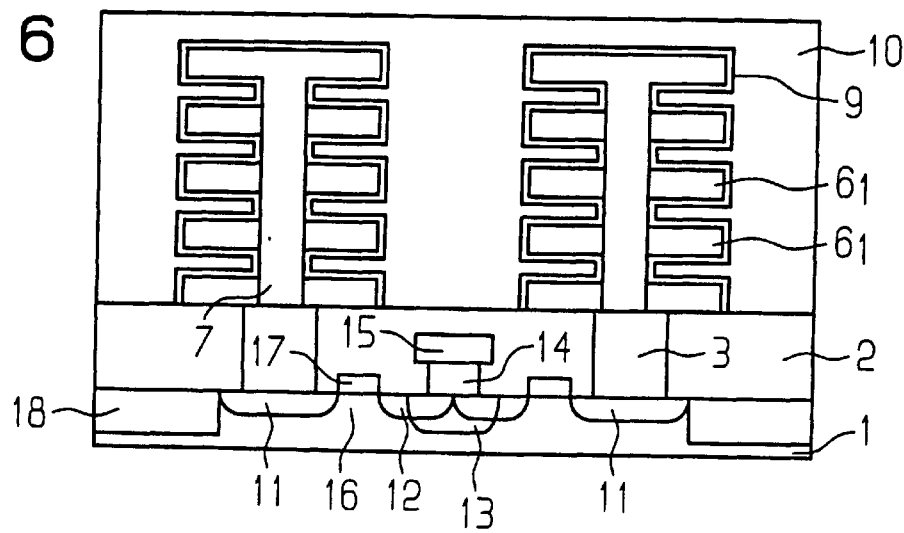

In FIG. 6, the section shown in the substrate 1 includes selecting transistors. The layers made of the doped silicon $6_1$ and the related supporting structure 7 form a first electrode (storage nodes) for a storage capacitor. The first electrode is connected to a source/drain region 11 of a selecting transistor through the contact disposed in the contact hole 3, and it can be seen that displacement of the supporting structure with respect to contact 3 does not produce damage. Another source/drain region 12 of the selecting transistor is connected to the corresponding source/drain region 12 of the neighboring selecting transistor through a connection region 13. The connection region 13 is furthermore connected with a trenched bit line 15 through a bit line contact 14. The trenched bit line 15 and the bit line contact 14 are surrounded by the insulating layer 2. A channel region 16, a gate dielectric (not shown) and a gate electrode which acts as a word line 17 are disposed between the source/drain regions 11 and 12 of a selecting transistor. The word line 17 and the bit line contact 14 are both formed from doped polysilicon. The bit line 15 is made of doped polysilicon, tungsten silicide or tungsten. On the side of the source drain region 11, which is away from the bit line 15, there is an insulation structure, for example, a flat trench 18 filled with insulating material (shallow trench insulation) for insulation between the neighboring selecting transistor pairs.

The second practical example will be described with the aid of FIGS. 7 to 11, where the same reference numbers are used as in the first practical example and in FIGS. 1 to 6. Below, only the differences from the first practical example will be explained in more detail.

Figure 7:
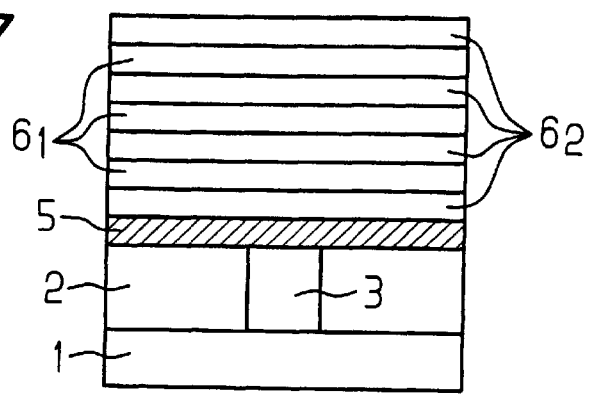
FIGS. 7 to 11 are sectional views of a second practical example of the method.

In FIG. 7 an auxiliary layer 5 acting as an etch-stop is formed, for example, from TEOS or silicon nitride with a layer thickness of 50 nm on the insulating layer 2. Then, as before, the layer sequence 6 is applied. The lowermost layer of the layer sequence, which lies on the auxiliary layer 5, consists here of the first material, but it can also consist of the second material.

Figure 8:
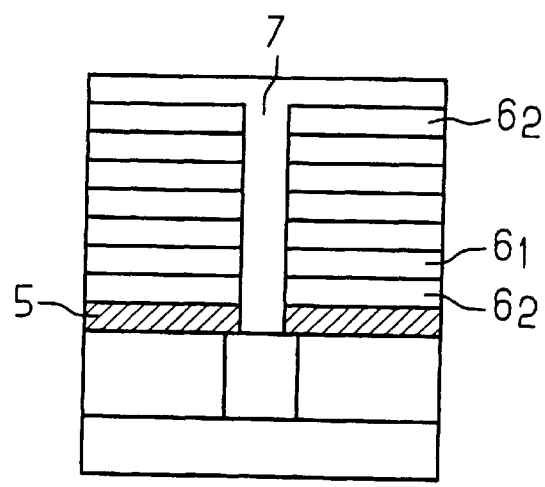

In FIG. 8 the opening is etched in the layer sequence 6, the auxiliary layer 5 serving as the etch-stop. Then, in a second etching step, the auxiliary layer is etched all the way through and the connection is freed. The filling of the opening to form the supporting structure 7 is done as described above.

Figure 9:
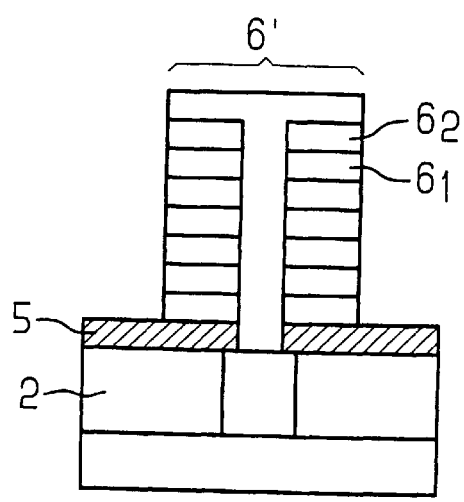

Then, in an etching process, which is selective with respect to the auxiliary layer, the layer sequence is structured to a layer structure as shown in FIG. 9. The etching processes described above have sufficient selectivity with respect to TEOS or silicon nitride.

Figure 10:
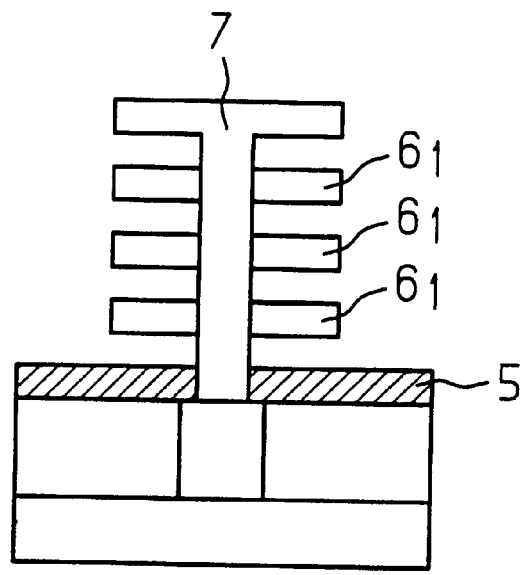

The free etching of the lamellae is done as described above, the etching being selective with respect to the first material and the auxiliary layer as shown in FIG. 10. When silicon nitride is used as the auxiliary layer, an especially high selectivity of about 1:1000 can be achieved with a solution which contains HF, $H_2O_2$ and $CH_3COOH$.

Figure 11:
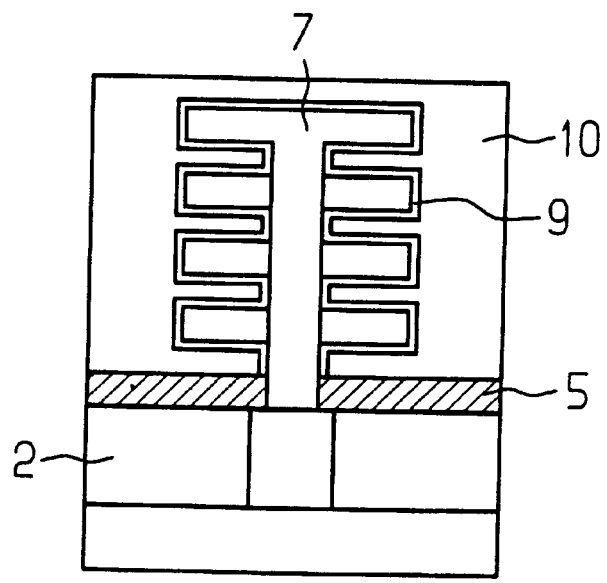

As in the first practical example, the capacitor is completed with the formation of the dielectric 9 and the counter electrode 10 as shown FIG. 11.

The third practical example is described with the aid of FIGS. 12–16, where the same reference numbers are used as in the previous examples and figures. Only the differences from the first and second practical example will be explained in more detail below.

Figure 12:
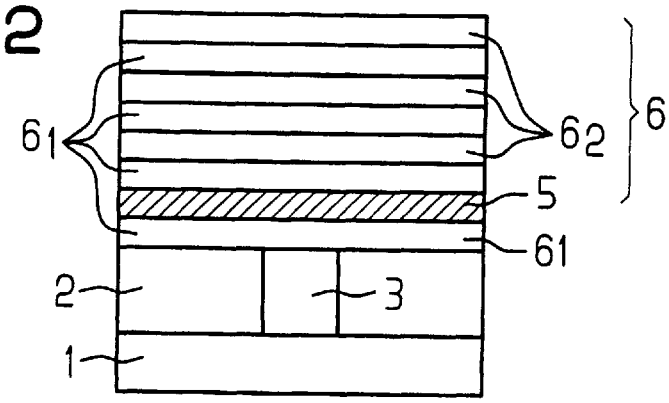
FIGS. 12 to 16 are sectional views of a third practical example of the method.

First, a layer of the first material and then the auxiliary layer 5 acting as etch-stop, for example, made of TEOS or silicon nitride, are formed on the carrier 2 with a layer thickness of 50 nm as shown in FIG. 12. Then the layer 6 sequence is applied as before. The lowermost layer of the layer sequence which lies on the auxiliary layer 5 consists of the first material.

Figure 13:
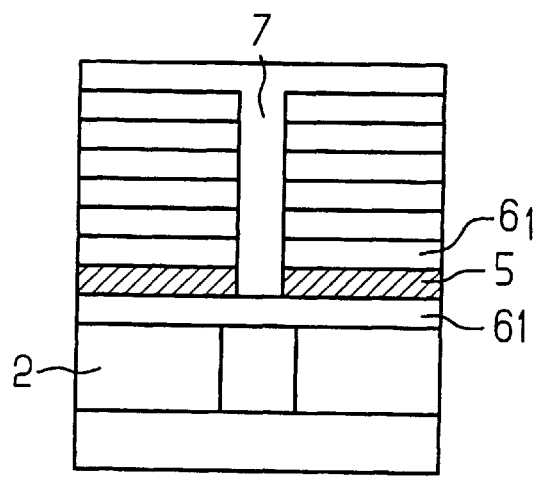

An opening is etched In the layer sequence 6, where the auxiliary layer 5 serves as the etch-stop in the first etching step as shown in FIG. 13. Then, in a second etching step, the auxiliary layer is etched all the way through so that the opening ends of the lowermost layer $6_1$, made of the first material. Suitable etching processes for silicon oxide and nitride are commonly known to experts in the field. The filling of the opening, preferably with polysilicon, to form the supporting structure, is done as described above.

Figure 14:
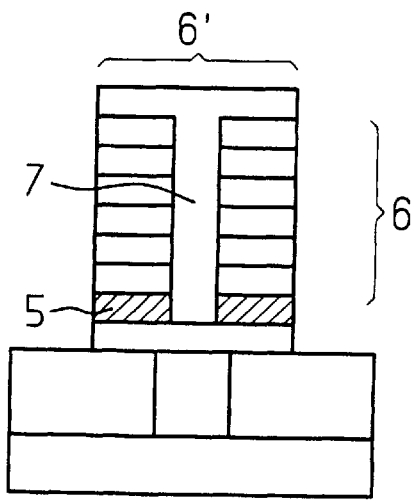

Then, in an etching process which can be carried out in several etching steps, the layer sequence is structured including the whole area of deposited polysilicon Layer, the auxiliary layer and the lowermost layer $6_1$, to produce the layer structure as shown in FIG. 14. Next to the layer structure, the carrier surface is free. The etching processes described above are suitable for structuring.

Figure 15:
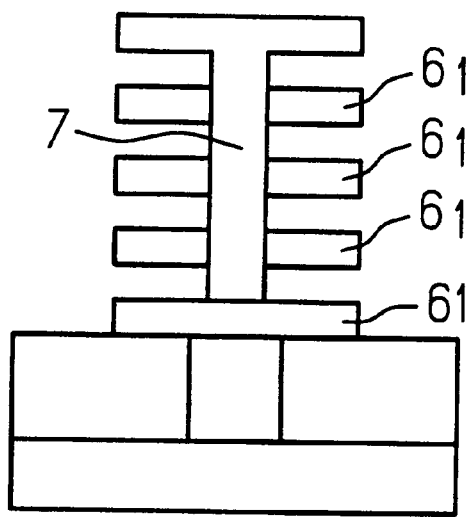

The free etching of the lamellae is done as described above, and the etching is selective with respect to the first material and in general, but not necessarily, also to the auxiliary layer as shown in FIG. 15. The auxiliary layer is removed simultaneously or subsequently.

Figure 16:
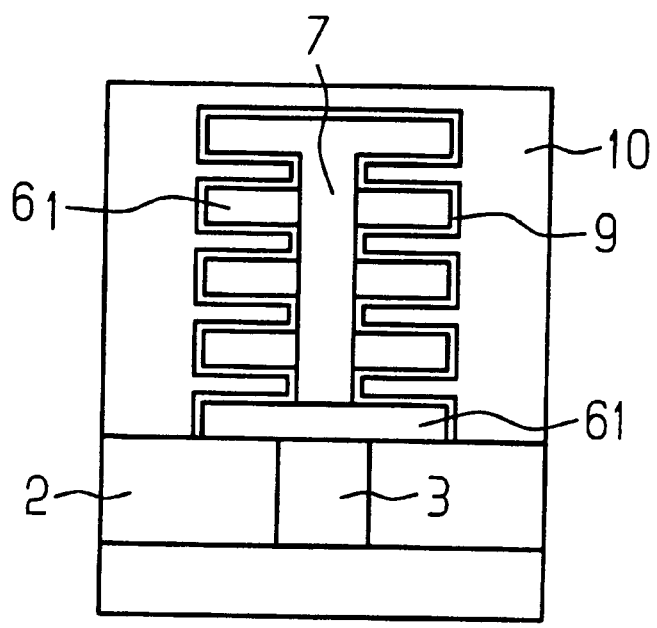

As in the first practical example, the capacitor is completed with the formation of the dielectric 9 and the counter electrode 10 as shown in FIG. 16.

We claim:

1. A method for producing a capacitor in an integrated circuit, which comprises:

preparing a substrate having a contact region;

applying a carrier formed of an insulating carrier material on the substrate;

producing a contact hole in the carrier above the contact region and filling the contact hole with an electrically conductive material;

applying a layer sequence on the carrier, the layer sequence containing alternatingly layers made of a conducting first material and a second material and a lowermost layer made of the conducting first material, the conducting first material and the second material being different from the carrier material;

forming an opening in the layer sequence;

filling in the opening with a conducting material and forming a supporting structure from the conducting material;

structuring the layer sequence and the supporting structure in an anisotropic etching process resulting in a layer structure corresponding to lateral dimensions of a capacitor and having an internal supporting structure;

removing selectively the layers formed of the second material with respect to the layers made of the conducting first material and the internal supporting structure;

applying a capacitor dielectric on free surfaces of the layers made of the conducting first material and of the internal supporting structure; and applying a counter electrode on a surface of the capacitor dielectric.

2. The method according to claim 1, wherein the conducting first material contains doped silicon and the second material contains germanium.

3. The method according to claim 1, wherein the conducting first material is $p^+$-doped polysilicon and the second material is selected from the group consisting of $p^-$-doped polysilicon and undoped polysilicon.

4. The method according to claim 1, which comprises:

applying an auxiliary layer to the carrier before the layer sequence is applied and the layer sequence is subsequently applied onto the auxiliary layer;

etching the layer sequence for forming the opening down to the auxiliary layer in a first etching step and in a second etching step etching through the auxiliary layer for finishing the opening during the step for forming the opening; and during the structuring step for forming the layer structure by etching the layer sequence and the supporting structure, the etching is carried out selectively with respect to the auxiliary layer.

5. The method according to claim 1, which comprises:

applying an auxiliary layer and a first layer made of the conducting first material onto the carrier before the layer sequence is applied, and subsequently applying the layer sequence onto the auxiliary layer;

etching the layer sequence for forming the opening down to the auxiliary layer in a first etching step and in a second etching step etching through the auxiliary layer for finishing the opening during the step for forming the opening;

etching the auxiliary layer and the first layer lying under the auxiliary layer during the structuring step for forming the layer structure; and removing selectively the auxiliary layer with respect to the layers made of the conductive first material before the step of applying the capacitor dielectric.

6. The method according to claim 4, wherein the auxiliary layer is made of a material selected from the group consisting of silicon oxide and silicon nitride.

7. The method according to claim 5, wherein the auxiliary layer is made of a material selected from the group consisting of silicon oxide and silicon nitride.

8. The method according to claim 1, wherein the supporting structure is formed of the conducting first material.

9. The method according to claim 1, which comprises forming the supporting structure by whole-surface deposition even on a horizontal surface of the layer sequence.

10. The method according claim 2, wherein the second material has a germanium content of between 10 and 100 mole % and a silicon content of between 0 and 90 mole %.

* * * * *